United States Patent
Kruedener et al.

(10) Patent No.: US 10,681,981 B2
(45) Date of Patent: Jun. 16, 2020

(54) METHOD FOR MANUFACTURING A SENSOR FOR A PART OF A PIECE OF FURNITURE

(71) Applicant: GRASS GmbH, Reinheim (DE)

(72) Inventors: Boris Kruedener, Kleinostheim (DE); Markus Herper, Muehltal (DE)

(73) Assignee: Grass GmbH & Co. KG, Reinheim (DE)

(*) Notice: Subject to any disclaimer, the term of this patent is extended or adjusted under 35 U.S.C. 154(b) by 12 days.

(21) Appl. No.: 15/407,584

(22) Filed: Jan. 17, 2017

(65) Prior Publication Data
US 2017/0172302 A1    Jun. 22, 2017

Related U.S. Application Data

(63) Continuation of application No. PCT/EP2015/078445, filed on Dec. 3, 2015.

(30) Foreign Application Priority Data

Jan. 22, 2015   (DE) .................. 10 2015 100 914

(51) Int. Cl.
*A47B 88/457*   (2017.01)
*A47B 97/00*    (2006.01)
(Continued)

(52) U.S. Cl.
CPC ............ *A47B 97/00* (2013.01); *A47B 88/457* (2017.01); *A47B 88/473* (2017.01); *B41M 1/38* (2013.01);
(Continued)

(58) Field of Classification Search
CPC combination set(s) only.
See application file for complete search history.

(56) References Cited

U.S. PATENT DOCUMENTS

2006/0197540 A1*  9/2006  Negoro ............... E05B 81/78
                                                   324/690
2008/0039585 A1*  2/2008  Nishioka ............... C08L 9/06
                                                   525/187
(Continued)

FOREIGN PATENT DOCUMENTS

DE   20 2005 006 945 U1   6/2006
DE   20 2014 003 058 U1   6/2014
(Continued)

OTHER PUBLICATIONS

Felix Schoeller Gruppe: "Gedruckte Elektronik als Helfer im Haushalt," (translated as Printed Electronics as a Helper in the Household), Sensorflächen per inkjet gedruckt (translated as Sensor surfaces printed by inkjet), Jun. 6, 2014, retrieved from the Internet: url:https://www.youtube.com/watch?v=5NrJo_QBOv4&feature=youtu.be.
(Continued)

*Primary Examiner* — Austin Murata
(74) *Attorney, Agent, or Firm* — Burr & Brown, PLLC

(57) ABSTRACT

A method for manufacturing a sensor for a part of a piece of furniture is described, in which method a layer, necessary for the actual sensor function, of the sensor is printed onto the part of the piece of furniture. Furthermore, a corresponding sensor, a part of the piece of furniture, a switching device and a piece of furniture are presented.

11 Claims, 2 Drawing Sheets

(51) Int. Cl.
  *H03K 17/96* (2006.01)
  *E05F 15/70* (2015.01)
  *B41M 1/38* (2006.01)
  *E05F 15/603* (2015.01)
  *E05F 15/60* (2015.01)
  *A47B 88/473* (2017.01)

(52) U.S. Cl.
  CPC ............ *E05F 15/60* (2015.01); *E05F 15/603* (2015.01); *E05F 15/70* (2015.01); *H03K 17/962* (2013.01); *A47B 2220/0091* (2013.01); *E05Y 2201/434* (2013.01); *E05Y 2400/44* (2013.01); *E05Y 2600/50* (2013.01); *E05Y 2900/20* (2013.01)

(56) References Cited

U.S. PATENT DOCUMENTS

2011/0204752 A1* 8/2011 Gao ................. H02N 2/183
  310/339
2012/0153787 A1* 6/2012 Busalt ................ F24C 15/02
  312/236
2013/0340342 A1* 12/2013 Ahlfeld .............. A47B 88/457
  49/31
2015/0296612 A1  10/2015 Gumbiowski et al.
2015/0364066 A1* 12/2015 Djafer ................ H01L 31/042
  40/559

FOREIGN PATENT DOCUMENTS

WO   2014/160491 A2   10/2014
WO   WO 2014/160491   * 10/2014

OTHER PUBLICATIONS

German Search Report (Application No. 10 2015 100 914.5) dated Oct. 7, 2015.
International Search Report and Written Opinion (Application No. PCT/EP2015/078445 dated Feb. 14, 2016.
English translation of International Preliminary Report on Paentability (Application No. PCT/EP2015/078445 dated Aug. 3, 2017.

* cited by examiner

METHOD FOR MANUFACTURING A SENSOR FOR A PART OF A PIECE OF FURNITURE

CROSS REFERENCE TO RELATED APPLICATIONS

This application is a continuation of International Application No. PCT/EP2015/078445 filed Dec. 3, 2015, which designated the United States, and claims the benefit under 35 USC § 119(a)-(d) of German Application No. 10 2015 100 914.5 filed Jan. 22, 2015, the entireties of which are incorporated herein by reference.

FIELD OF THE INVENTION

The present invention relates to a method for manufacturing a sensor for a part of a piece of furniture and a sensor for a part of a piece of furniture, a part of a piece of furniture, a switching device and a piece of furniture.

BACKGROUND OF THE INVENTION

In the field of the construction of furniture, furniture is being increasingly equipped with electrical and electronic components in order to make its use, for example, easier, in particular, more convenient.

Compared to mechanical devices for activating and driving, for example, movable parts of pieces of furniture such as, for example, drawers and doors, electrical and electronic devices frequently have advantages in terms of the space they require and their adaptability. However, hitherto no significant advantages have been obtained by means of electrical or electronic components for manufacturing furniture or parts of pieces of furniture as a replacement for mechanical devices. Under certain circumstances, the expenditure of manufacture is even increased because electrical lines for transmitting energy and, possibly also signals have to be additionally integrated into a piece of furniture.

SUMMARY OF THE INVENTION

The present invention is based on the object of efficiently providing a part of a piece of furniture with a space-saving sensor.

The present invention is based on a method for manufacturing a sensor for a part of a piece of furniture. The core of the present invention is that a layer, necessary for the actual sensor function, of the sensor is printed onto the part of the piece of furniture. A plurality of, in particular all of, the layers of the sensor are preferably printed onto the part of the piece of furniture. Advantageously efficient manufacturing is obtained by virtue of the fact that, in particular, the entire sensor is manufactured in such a way that one or more layers of the sensor are printed onto the part of the piece of furniture. A multiplicity of printing methods, for example, relief printing, flat printing and through-printing (for example, screen printing) which can be adapted advantageously to a wide range of requirements of the material of the sensor layer as well as the material and the shape of the part of the piece of furniture, in particular, an application point for the sensor, are known. In this context, printing onto a part of a piece of furniture can be carried out comparatively quickly. In particular if the sensor can be manufactured mostly or completely by printing on one or more layers, the method according to the present invention permits a part of a piece of furniture to be equipped efficiently with the sensor in one embodiment which is advantageously arranged inconspicuously on an outer side, in particular, a front side, of a part of a piece of furniture which can be viewed satisfactorily. Particularly when a part of a piece of furniture is produced in relatively large numbers, the method according to the present invention permits manufacturing costs for a part of a piece of furniture with a sensor to be advantageously reduced.

A layer which is necessary for an actual sensor function can be composed, for example, of an electrically conductive coating material with which, for example, an electrode for a capacitive sensor can be printed on. A further example is a piezo-electric coating material with which a layer for a pressure-sensitive sensor can be formed. In contrast, a layer which is necessary for the actual sensor function is not intended to mean a layer such as, for example, a layer of adhesive which is provided merely for mounting the sensor on a surface of the part of the piece of furniture. A layer, for example, a color coating, which serves merely to emphasize the sensor visibly or to make the sensor appear as inconspicuous as possible, is not to be understood here as a layer which is necessary for the actual sensor function. Furthermore, a layer which serves only for assisting the printing on is also not considered to be a layer which is necessary for the sensor function. However, if a layer such as, for example, a mounting layer or such as, for example, a color coating is selected for ensuring, for example, that an undesired or even disruptive influence of the part of the piece of furniture on the method of functioning of the sensor is screened, this is a layer which is necessary for the actual method of functioning. Therefore, for example, an adhesion foundation layer on a metallic surface of the part of the piece of furniture can also be provided for the purpose of electrical insulation of the sensor, in particular, of electrically conductive layer structures of the sensor, with respect to the metallic surface of the part of the piece of furniture, and for this purpose can be applied in a suitable layer thickness.

So that the sensor can be used, for example, as an activation element, it is preferred that one or more layers of the sensor are printed onto a surface region of the part of the piece of furniture, which surface region is provided as an outer side of the part of the piece of furniture.

In order to supply the sensor, for example, with energy for operation and in order, under certain circumstances, to make available signal lines for sensor detection, at least one line which is for the transmission of energy and/or signals and is connected to the sensor is printed onto the part of the piece of furniture. As a result, it is advantageously possible to dispense with the provision of line wires or line cables for an energy connection or signal connection on or in the part of the piece of furniture.

A signal transmission device for a signal of the sensor is preferably printed at least partially onto a part of a piece of furniture, in particular, the same part of the piece of furniture. Therefore, a measured value which is detected at the sensor can be conditioned in the vicinity of the sensor for transmission to a control device, as a result of which sensor detection during a transmission can be disrupted to a lesser degree. In this context, it is possible to dispense with corresponding transmission lines if the signal transmission device is configured for a cableless signal transmission via, for example, radio waves or, for example, light.

Furthermore, it is preferred that an energy supply device for the sensor is, at least partially, printed onto a part of a piece of furniture, in particular, the same part of the piece of furniture. For this purpose, for example, a photovoltaic element can, for example, be printed onto an outer side of the part of the piece of furniture. The part of the piece of furniture is preferably provided with an energy supply device in the form of an electrical accumulator and, in particular, with an autonomous energy generator, in order to compensate at least partially for chronological fluctuations of the energy supply. If the part of the piece of furniture is, for example, a door, it may be equipped, for example, with an energy recovery device, in particular, an energy generator for so-called energy harvesting with which, for example, movements of the part of the piece of furniture or, for example, heating of a region of the part of the piece of furniture when touched, for example, with a hand can be converted into electrical energy. So that sufficient energy is always available for operating the sensor, the part of the piece of furniture is provided with an energy store such as, for example, an accumulator, which, under certain circumstances, is also printed at least partially onto the part of the piece of furniture.

Furthermore, it is preferred that after the printing on of a layer or of a plurality of layers of the sensor onto the part of the piece of furniture, a protective layer is applied over the sensor. The protective layer can, for example, reduce or avoid wear of the sensor as a result of abrasion, wherein the sensor itself is, under certain circumstances, covered with a colored layer, so that it cannot be seen.

Furthermore, a preferred embodiment of the present invention comprises the fact that a layer which is prepared for the printing on of the sensor is applied to the part of the piece of furniture before a first layer of the sensor is applied to the part of the piece of furniture. With the prepared layer the sensor can be electrically insulated from the material of the piece of furniture and, if appropriate, its adhesion to the subsurface can be improved.

A layer of the sensor is preferably printed onto the part of the piece of furniture before an electrical or an electronic component is mounted on the part of the piece of furniture. In this context, the component can also be a part of the sensor which is necessary for its function, if the sensor can, for example, be manufactured only partially by printing on. The electrical or electronic component can, under certain circumstances, be a conventional three-dimensional component such as, for example, a line wire, a passive component, such as, for example, an electrical capacitor or an electrical resistor, a semiconductor component, a populated or non-populated circuit board, a switch relay and the like.

Furthermore a layer of the sensor can be printed onto the part of the piece of furniture after an electrical or an electronic component has been mounted on the part of the piece of furniture. In this context, under certain circumstances, a depression can be formed on the part of the piece of furniture, on a surface which is adapted to the component in such a way that with the component which is inserted into the depression a uniformly flush or smooth, for example, level, surface is produced for printing on a layer of the sensor. For example, electrical or electronic components which contribute to the function of the sensor could be adhered, in the form of SMD components, to a surface of the part of the piece of furniture, in particular, in depressions, and connected at least partially to further, for example, conductive elements of the sensor, by means of, for example, a layer which is applied by means with a specially shaped compression die.

Within the scope of the present invention, a sensor is correspondingly proposed for a part of a piece of furniture, which sensor is printed onto the part of the piece of furniture. The sensor can be embodied in a comparatively flat and as a result advantageously space-saving fashion.

A part of a piece of furniture having a sensor according to the present invention can correspondingly make available, for example, more storage space. Moreover, the part of the piece of furniture has, as a result of a printed-on sensor, fewer elevated portions which, under certain circumstances, can collide with other objects during use and be damaged in the process. In this context, it is particularly preferred that the part of the piece of furniture is provided for movable mounting on a piece of furniture, as a result of which, for example, a sensor can be used for activating a movably mounted part of a piece of furniture, for example for moving it out. The sensor can additionally be arranged on a movable part of a piece of furniture in such a way that said sensor can be relatively easily reached.

The basic concept of the present invention can be further developed to form a switching device for influencing a controllable functional unit of a piece of furniture. The switching device comprises a sensor element with which a switching process of the functional unit can be controlled. The core of the switching device according to the present invention consists in applying layers of the sensor element to a surface of a part of the piece of furniture. The sensor element is preferably at least partially printed onto the part of the piece of furniture here. As a result, the sensor element can advantageously be embodied in a space-saving fashion. Owing to the at least partially layer-formed structure, the sensor is advantageously adapted for arrangement on a surface of a part of a piece of furniture. As a result, the sensor element and under certain circumstances, the switching device can advantageously be mounted inconspicuously on a surface, in particular, on an outer side of a part of a piece of furniture and of a piece of furniture.

The functional unit can be an electronic, for example, open-loop control unit or, for example, closed-loop control unit. In this context, the functional unit can be designed to control an, in particular, electrical assembly which can be, inter alia, a drive of a movable part of a piece of furniture such as, for example, a drawer. The sensor element can be provided as a switching element in the switching device, which switching element differentiates, in particular, two switched states from one another. As a result, the switching device can be used, for example, as an activation element.

Furthermore, the sensor element can be provided in the switching device as a component of a measuring device with which the switching device is designed to differentiate more than two, for example continuous or, for example, discrete, switching conditions. The switching device can be here, for example, a signal generator for the functional unit, with which signal generator an intensity of the change in the discrete or continuous form can also be detected in addition to a change in a condition of use as such, and can be used to control the functional unit. For example, the switching device can convey a change in temperature to the functional unit in various stages by means of the sensor element.

In accordance with the sensor element, the switching device can be switched with different effects. An electrical conductivity of the sensor element can be variable by means of pressure and/or temperature. Furthermore, an electrical capacitance of the sensor element can be variable by means of pressure and/or by means of temperature and/or by means of a distance of a polarizable object. In particular, in order to convey a continuously variable value, the switching device is designed in such a way that the sensor element can be connected to the functional unit by means of a galvanic line. Furthermore, cableless connecting means, with which the sensor element can be connected to the functional unit, can be provided.

BRIEF DESCRIPTION OF THE DRAWINGS

The present invention will be explained below by means of exemplary embodiments and described in more detail with reference to the drawings. The drawings are not to scale and represent the present invention schematically.

DETAILED DESCRIPTION OF THE INVENTION

Figure 1:
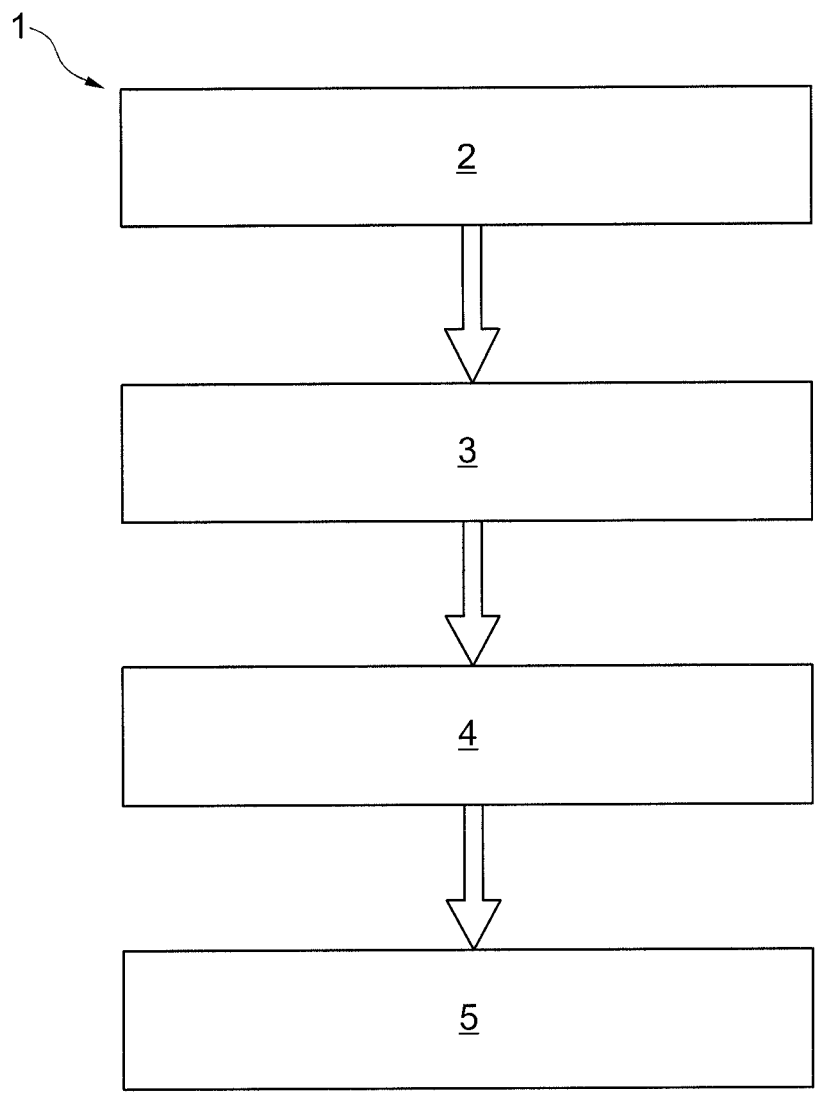
FIG. 1 shows a diagram illustrating a sequence of a method according to the present invention.
Figure 2:
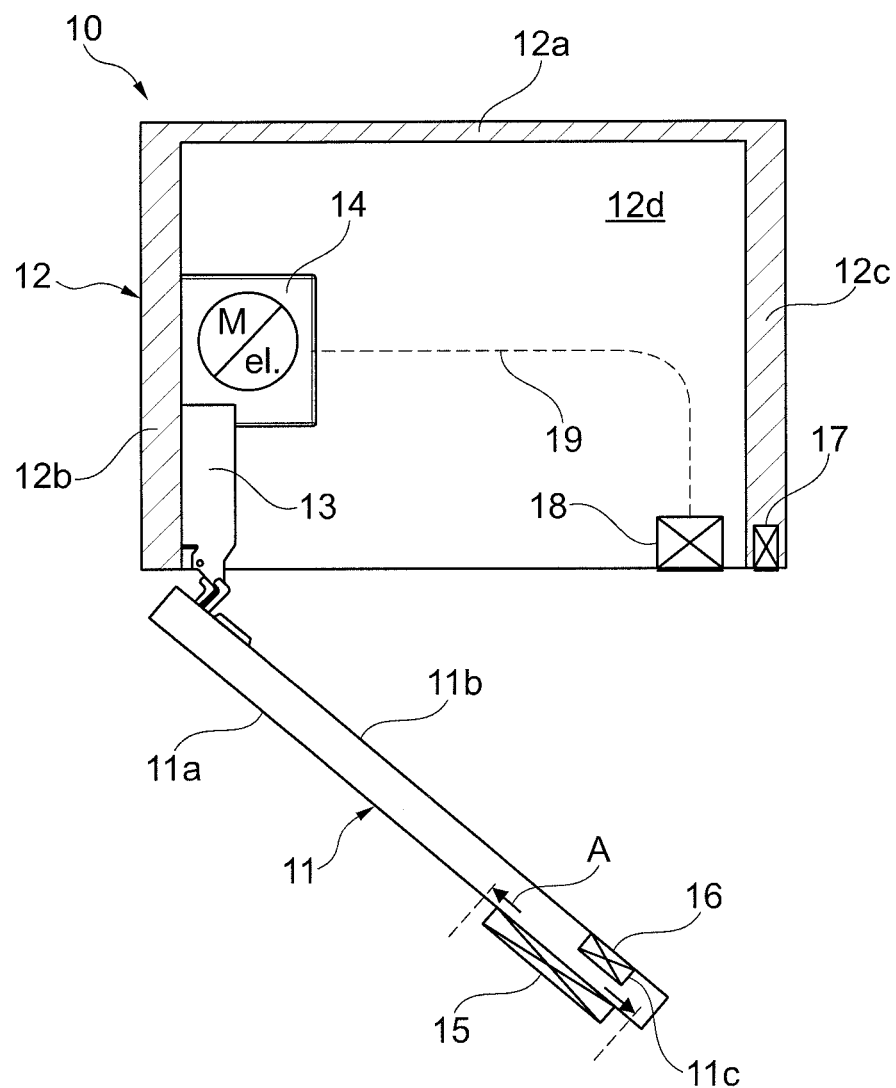
FIG. 2 shows a plan view of a horizontal section through a piece of furniture according to the present invention.

FIG. 1 shows an exemplary embodiment of a method 1 according to the present invention, in which a part 11 of a piece of furniture 10 is manufactured in four method steps 2, 3, 4 and 5. An exemplary embodiment of a piece of furniture 10 according to the present invention is shown in FIG. 2. The part 11 of the piece of furniture can be a component of a furniture carcass 12 or a movable part of a piece of furniture such as, for example, a door and, for example, a drawer.

In a first method step 2, the part 11 of the piece of furniture can be manufactured to such an extent that the part of the piece of furniture can be printed. The method step 2 can comprise a multiplicity of processing steps (not illustrated) with which the part 11 of the piece of furniture can mainly or completely be manufactured as far as its ultimate mechanical dimensions. For example, the method step 2 can have a processing step (not shown) in which the part of the piece of furniture is cut out as a blank shape from a, for example, panel-shaped base body. A surface region A of a surface 11a of the part 11 of the piece of furniture which is provided for the arrangement of a sensor 15 is preferably prepared in the course of the method step 2 in such a way that it can be printed on, and material printed onto the surface region A can adhere permanently during a subsequent method step 3. The surface on the surface region A can for this purpose be smoothed, and if appropriate, made level, by grinding or, for example, by applying a filler material.

In the method according to the present invention, in a method step 3 at least one layer (not shown) of the sensor 15, which layer is necessary for the actual sensor function, is printed onto the surface region A. The method step 3 can be embodied here in a plurality of processing steps in which various layers of the sensor are, for example, printed one on top of the other and, for example, printed one next to the other onto the surface region A. In this context, the method step 3 can comprise as a processing step at least one fixing phase (not shown) in which a printed-on layer of the sensor 15 is, for example, dried and, for example, fixed by irradiation, for example, with light. A fixing phase can, for example, stabilize the material of a printed-on layer for a subsequent printing process and can form a connection between two printed-on layers. The method step 3 can print on, as a processing step, a finishing layer with which the sensor 15 can be protected against external influences.

After the sensor 15 has been printed onto the part 11 of the piece of furniture in the method step 3, the part 11 of the piece of furniture can be completed in a method step 4 by means of further processing steps (not shown). In this context, the part 11 of the piece of furniture can be connected, for example, to an electrical line element or to an electronic component. Furthermore, the part 11 of the piece of furniture can, for example, be printed, sprayed or, for example, also dipped, with an application of a coloring medium in order to color it. Furthermore, at least one additional part (not shown) such as, for example, a fitting element, a grip element, a decorative strip or a lighting means can also be mounted on the part 11 of the piece of furniture.

FIG. 2 shows an exemplary embodiment of a piece of furniture 10 according to the present invention in the form of a cupboard which has a movable part 11 of a piece of furniture in the form of a door of a piece of furniture. The door 11 of the piece of furniture is pivotably mounted on a side wall 12b of a furniture carcass 12 of the piece of furniture 10 so as to be pivotable about a vertical axis with at least one hinge fitting 13. The hinge fitting 13 is mechanically constructed in such a way that a drive unit 14, with which forces can be transmitted to the part 11 of the piece of furniture via the hinge fitting 13 and with which an opening movement and/or closing movement of the part 11 of the piece of furniture can be driven, can be coupled thereto.

On an application region A on an outer surface region 11a of the part of the piece of furniture, here the door 11 of the piece of furniture, a sensor 15 is at least partially printed onto the application region A according to the inventive method. If appropriate, further components (not illustrated individually) of the sensor 15 can be mounted on the application region A. The sensor 15 is preferably provided as a trigger for activating, in particular, the drive unit 14.

The part 11 of the piece of furniture can be equipped with a further sensor 16 with which, for example, the bearing of an inner surface 11b of the door 11 of the piece of furniture on the furniture carcass can be detected. In this context, for example, a component (not shown) of the sensor 16 can require a comparatively large three-dimensional installation space which is made available in the form of a recess 11c. In this context, this sensor can also be partially printed on in that, after the insertion of the component into the recess 11c, for example, electrical line connections (not shown) can be printed onto the inner surface 11b and onto the inserted component.

Supply lines (not shown) for electrical energy and transmission lines for electrical, line-bound signal transmission can be led, for example, via the hinge fitting 13. Furthermore, the piece of furniture 10 can comprise a detection device 18 which is arranged, for example, on a compartment floor 12d or floor 12d of a piece of furniture in the furniture carcass 12, in particular, on the front side, in order to detect changes in state at the sensors 15 and 16, which changes can be transmitted from the sensors 15 and 16 to the detection device 18, for example, via a short-range radio transmission. The detection device 18 has in turn a signal link 19 which can comprise a line cable or a radio link and with which the detection device 18 is connected to the drive unit 14. In a side wall 12c of the furniture carcass 12, a damping element 17 can be inserted which is preferably provided with an energy recovery device (not shown). As a result, for example the detection device 18 can be supplied with energy autonomously and with comparatively low expenditure.

LIST OF REFERENCE NUMBERS

1 Method
2 Method step
3 Method step
4 Method step
5 Method step
10 Piece of furniture
11 Part of a piece of furniture 11a Surface region
11b Surface region
11c Recess
12 Furniture carcass
12a Rear wall wall
12b Side wall
12c Side wall
12d Floor
13 Hinge fitting
14 Drive unit
15 Sensor
16 Sensor
17 Damping element
18 Detection device
19 Signal link

The invention claimed is:

1. A method for manufacturing first and second sensors for a part of a piece of furniture, the furniture including a furniture carcass, the method comprising: providing a recess having first dimensions in an inner surface of the part of the piece of furniture, printing at least a sensor functional layer of the first sensor onto the outer surface of the part of the piece of furniture, and printing at least a sensor functional layer of the second sensor in the recess defined in the inner surface of the part of the piece of furniture, the second sensor having second dimensions substantially the same as the first dimensions, thereby defining a second sensor outer surface substantially aligned with the inner surface of the part of the piece of furniture, the inner surface of the part of the piece of furniture opposing the furniture carcass, the first sensor being a trigger activating a drive unit which drives the part of the piece of furniture relative to the furniture carcass, the second sensor detecting a bearing of the part of the part of the piece of furniture on the furniture carcass, wherein a detection device provided in the furniture carcass detects changes in state at the first and second sensors, the changes in state being transmitted from the first and second sensors, and includes a signal link to the drive unit, and wherein a damping device provided in the furniture carcass supplies energy to the detection device.

2. The method as claimed in claim 1, wherein a plurality of layers of at least one of the first and second sensors are printed onto the part of the piece of furniture.

3. The method as claimed in claim 1, wherein at least one of the first and second sensors is manufactured with one or more layers thereof printed onto the part of the piece of furniture.

4. The method as claimed in claim 1, wherein at least one line which is for transmission of energy and/or signals and is connected to at least one of the first and second sensors is printed onto the part of the piece of furniture.

5. The method as claimed in claim 1, wherein a signal transmission device for a signal of at least one of the first and second sensors is printed onto the part of the piece of furniture.

6. The method as claimed in claim 1, wherein an energy supply device for at least one of the first and second sensors is printed onto the part of the piece of furniture.

7. The method as claimed in claim 1, wherein after printing the at least the sensor functional layer of the first sensor onto the outer surface of the part of the piece of furniture, a protective layer is applied over the first sensor.

8. The method as claimed in claim 1, wherein a printing preparation layer is applied onto the part of the piece of furniture before the at least the sensor functional layer of the first sensor is printed onto the outer surface of the part of the piece of furniture.

9. The method as claimed in claim 1, wherein the at least the sensor functional layer of the first sensor is printed onto the outer surface of the part of the piece of furniture before an electrical or an electronic component is mounted on the part of the piece of furniture.

10. The method as claimed in claim 1, wherein the at least the sensor functional layer of the first sensor is printed onto the outer surface of the part of the piece of furniture after an electrical or an electronic component has been mounted on the part of the piece of furniture.

11. A method for manufacturing a movable furniture part having sensors provided thereon, the method comprising:

printing at least one sensor layer of at least a first sensor on a first surface of the movable furniture part, the first sensor being a trigger activating a drive unit which drives the movable furniture part relative to a furniture carcass; and providing a recess having first dimensions in a second surface of the movable furniture part opposite the first surface thereof and opposing the furniture carcass;

printing at least one sensor layer of a second sensor having second dimensions substantially the same as the first dimensions in the recess, thereby defining a second sensor outer surface substantially aligned with the inner surface, the second sensor detecting a bearing of the part of the piece of furniture on the furniture carcass;

wherein the printing comprises one of relief printing, flat printing, or screen printing.

* * * * *